United States Patent
Choi et al.

(10) Patent No.: US 9,178,020 B2
(45) Date of Patent: Nov. 3, 2015

(54) GRAPHENE STRUCTURE AND METHOD OF MANUFACTURING THE GRAPHENE STRUCTURE, AND GRAPHENE DEVICE AND METHOD OF MANUFACTURING THE GRAPHENE DEVICE

(71) Applicants: SAMSUNG ELECTRONICS CO., LTD., Suwon-si (KR); SUNGKYUNKWAN UNIVERSITY FOUNDATION FOR CORPORATE COLLABORATION, Suwon-si (KR)

(72) Inventors: Byoung-lyong Choi, Seoul (KR); Eun-kyung Lee, Seoul (KR); Dong-mok Whang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/558,923

(22) Filed: Dec. 3, 2014

(65) Prior Publication Data

US 2015/0144885 A1 May 28, 2015

Related U.S. Application Data

(62) Division of application No. 13/470,487, filed on May 14, 2012, now Pat. No. 8,927,414.

(30) Foreign Application Priority Data

Jun. 27, 2011 (KR) .................. 10-2011-0062482

(51) Int. Cl.
*H01L 21/4763* (2006.01)
*H01L 23/58* (2006.01)
(Continued)

(52) U.S. Cl.
CPC ............ *H01L 29/1606* (2013.01); *B82Y 10/00* (2013.01); *H01L 21/0245* (2013.01); *H01L 21/0262* (2013.01); *H01L 21/02164* (2013.01);
(Continued)

(58) Field of Classification Search
CPC .................. H01L 29/1606; H01L 2924/13088
USPC ........... 438/623, 725, 780–794; 257/642, 759
See application file for complete search history.

(56) References Cited

U.S. PATENT DOCUMENTS 7,732,859 B2 * 6/2010 Anderson et al. ............. 257/328
8,105,928 B2 * 1/2012 Lin et al. ....................... 438/539
(Continued)

FOREIGN PATENT DOCUMENTS

JP 2011032156 A 2/2011
KR 1020100055098 A 5/2010
(Continued)

OTHER PUBLICATIONS

Communication dated May 14, 2013 issued by the European Patent Office in counterpart European Patent Application No. 12173032.9.
(Continued)

*Primary Examiner* — Calvin Lee
(74) *Attorney, Agent, or Firm* — Sughrue Mion, PLLC (57) ABSTRACT

A graphene structure and a method of manufacturing the graphene structure, and a graphene device and a method of manufacturing the graphene device. The graphene structure includes a substrate; a growth layer disposed on the substrate and having exposed side surfaces; and a graphene layer disposed on the side surfaces of the growth layer.

13 Claims, 12 Drawing Sheets (51) Int. Cl.
*H01L 29/16* (2006.01)
*H01L 21/02* (2006.01)
*H01L 29/06* (2006.01)
*H01L 29/66* (2006.01)
*H01L 29/775* (2006.01)
*H01L 29/786* (2006.01)
*B82Y 10/00* (2011.01)
*H01L 29/78* (2006.01)
*B82Y 30/00* (2011.01)
*B82Y 40/00* (2011.01)

(52) U.S. Cl.
CPC .... *H01L 21/02381* (2013.01); *H01L 21/02491* (2013.01); *H01L 21/02527* (2013.01); *H01L 21/02639* (2013.01); *H01L 21/02645* (2013.01); *H01L 29/0673* (2013.01); *H01L 29/66045* (2013.01); *H01L 29/66439* (2013.01); *H01L 29/66742* (2013.01); *H01L 29/775* (2013.01); *H01L 29/78684* (2013.01); *H01L 29/78696* (2013.01); *B82Y 30/00* (2013.01); *B82Y 40/00* (2013.01); *H01L 29/785* (2013.01)

(56) References Cited

U.S. PATENT DOCUMENTS

| | | | |
|---|---|---|---|
| 8,133,793 | B2 | 3/2012 | Li et al. |
| 8,358,008 | B2 | 1/2013 | Wada et al. |
| 8,467,224 | B2 | 6/2013 | Schricker et al. |
| 8,785,912 | B2 * | 7/2014 | Chung et al. ............ 257/29 |
| 2008/0290941 | A1 | 11/2008 | Ludwig |
| 2009/0020764 | A1 | 1/2009 | Anderson et al. |
| 2010/0055388 | A1 | 3/2010 | Chen et al. |
| 2011/0048625 | A1 | 3/2011 | Caldwell et al. |

FOREIGN PATENT DOCUMENTS

| | | |
|---|---|---|
| KR | 1020110006644 A | 1/2011 |
| KR | 1020110109680 A | 10/2011 |
| WO | 2011046655 A2 | 4/2011 |

OTHER PUBLICATIONS

Cranford, et al., "Twisted and coiled ultralong multilayer graphene ribbons", Modeling and Simulation in Materials Science and Engineering, vol. 19, No. 5, Jun. 23, 2011, pp. 1-9, XP002696221.

Murali et al., "Breakdown Current Density of Graphene Nanoribbons," Applied Physics Letters, vol. 94, No. 243114, Jun. 19, 2009, pp. 1-3.

Kosynkin et al., "Longitudinal Unzipping of Carbon Nanotubes to Form Graphene Nanoribbons," Macmillan Publishers Limited, vol. 458, Apr. 16, 2009, pp. 872-877.

Sprinkle et al., "Scalable Templated Growth of Graphene Nanoribbons on SiC," Macmillan Publishers Limited, Nature Nanotechnology, vol. 5, Oct. 3, 2010, pp. 727-731.

Bai et al., "Graphene Nanomesh," Macmillan Publishers Limited, Nature Nanotechnology, vol. 5, Feb. 14, 2010, pp. 190-194.

Xia et al., "Graphene Field-Effect Transistors with High On/Off Current Ratio ad Large Transport Band Gap at Room Temperature," American Chemical Society, IBM Thomas J. Watson Research Center, vol. 10, Jan. 21, 2010, pp. 715-718.

Son et al., "Energy Gaps in Graphene Nanoribbons," The American Physical Society, Physical Review Letters, vol. 97, No. 216803, Nov. 22, 2006, pp. 1-4.

* cited by examiner

GRAPHENE STRUCTURE AND METHOD OF MANUFACTURING THE GRAPHENE STRUCTURE, AND GRAPHENE DEVICE AND METHOD OF MANUFACTURING THE GRAPHENE DEVICE

CROSS-REFERENCE TO RELATED APPLICATIONS

This application is a divisional of U.S. patent application Ser. No. 13/470,487, filed on May 14, 2012, which claims priority from Korean Patent Application No. 10-2011-0062482, filed on Jun. 27, 2011 in the Korean Intellectual Property Office, the disclosures of which are incorporated herein in their entirety by reference.

BACKGROUND

1. Field

The present disclosure relates to graphene, and more particularly, to graphene structures and methods of manufacturing the graphene structures, and graphene devices and methods of manufacturing the graphene devices.

2. Description of the Related Art

While carbon nanotubes (CNTs) have been popularized since the 1990s, currently, research is being actively conducted on graphene that is applicable to various fields including nanoelectronics, optoelectronics, and chemical sensors. Graphene is a thin film material which has a thickness of several nanometers and in which carbon atoms are two-dimensionally aligned, and has very high electric conductivity. In addition to electrical characteristics of higher charge mobility in comparison to silicon, graphene is chemically stable and has a large surface area.

In order to use graphene to form a channel of a transistor, a bandgap of the graphene needs to have semiconductor characteristics and thus the graphene needs to have a very small width of about several nanometers. However, if graphene is formed to have a small width by using a patterning or etching method, it may be difficult to form the graphene on a large area in a desired shape. Also, when a graphene device such as a transistor is manufactured by using graphene having a small width, it may be difficult to bond the graphene to an electrode.

SUMMARY

Embodiments provide graphene structures and methods of manufacturing the graphene structures, and graphene devices and methods of manufacturing the graphene devices.

According to an aspect of an embodiment, there is provided a graphene structure including a substrate; a growth layer formed on the substrate and having exposed side surfaces; and a graphene layer grown from the side surfaces of the growth layer.

The growth layer may include metal or germanium (Ge). The graphene structure may further include a protective layer formed to cover an upper surface of the growth layer.

The graphene layer may have a width of several nanometers.

The graphene structure may further include at least one growth layer and at least one protective layer alternately stacked on the protective layer and having exposed side surfaces; and at least one graphene layer grown from the side surfaces of the at least one growth layer.

According to an aspect of another embodiment, there is provided a method of manufacturing a graphene structure, the method including alternately forming at least one growth layer and at least one protective layer on a substrate; forming a groove having a predetermined shape to expose side surfaces of the at least one protective layer and the at least one growth layer and an upper surface of the substrate; and growing at least one graphene layer from the side surfaces of the at least one growth layer exposed by the groove.

The at least one graphene layer may be grown from the exposed side surfaces of the at least one growth layer by using a chemical vapor deposition (CVD) method.

According to an aspect of another embodiment, there is provided a graphene device including at least one channel comprising a first graphene layer; and first and second electrodes connected to two ends of the at least one channel and comprising a second graphene layer.

The first and second electrodes may be integrally formed with the at least one channel. Here, the first graphene layer may be formed perpendicularly to and may be electrically connected to the second graphene layer.

A plurality of channels may be formed between the first and second electrodes, and may be aligned in at least one of a horizontal direction and a vertical direction.

According to an aspect of another embodiment, there is provided a method of manufacturing a graphene device, the method including sequentially forming a growth layer and a protective layer on a substrate; forming at least one first groove for exposing side surfaces of the growth layer and the protective layer and an upper surface of the substrate, and second and third grooves for exposing side surfaces of the protective layer and an upper surface of the growth layer; forming at least one channel by growing at least one first graphene layer from the side surfaces of the growth layer exposed by the at least one first groove; and forming first and second electrodes by growing a second graphene layer from the upper surface of the growth layer exposed by the second and third grooves.

The second and third grooves may be connected to two ends of the at least one first groove. The first and second electrodes may be integrally formed with the at least one channel.

The first and second graphene layers may be grown from the exposed side surfaces and the upper surface of the growth layer by using a CVD method.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIGS. 1, 2A and 2B, and 3A through 3C are diagrams for describing a method of manufacturing a graphene structure according to an embodiment.

Figure 1:
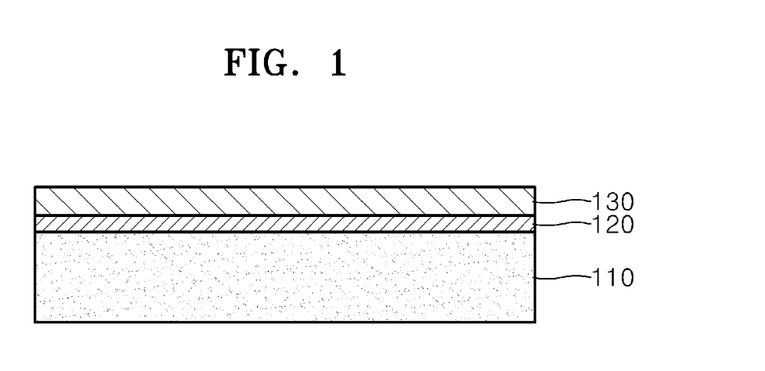
FIGS. 1, 2A and 2B, and 3A through 3C are diagrams for describing a method of manufacturing a graphene structure according to an embodiment.

FIG. 1 is a cross-sectional view showing that a growth layer 120 and a protective layer 130 are sequentially formed on a substrate 110. Referring to FIG. 1, initially, the growth layer 120 is formed on the substrate 110. The substrate 110 may be, for example, a silicon substrate, and may also be formed of various materials. The growth layer 120 may be formed by depositing a predetermined material in the form of a thin film on the substrate 110. The growth layer 120 is a layer from which a graphene layer 140 (see FIG. 3A) grows, and may be formed of, for example, metal or germanium (Ge). Here, the metal may include, but is not limited to, transition metals such as nickel (Ni), platinum (Pt), ruthenium (Ru), cobalt (Co), iridium (Ir), and copper (Cu). Meanwhile, if the growth layer 120 is formed of Ge, the graphene layer 140 may be grown in an uncontaminated state with a uniform thickness. The growth layer 120 may have a thickness of, for example, about several nanometers. As will be described later, the thickness of the growth layer 120 determines a width W of the graphene layer 140. Then, the protective layer 130 is formed on an upper surface of the growth layer 120. The protective layer 130 may be formed by depositing, for example, silicon oxide on the upper surface of the growth layer 120. The protective layer 130 may also be formed of a material other than silicon oxide.

Figure 2A:
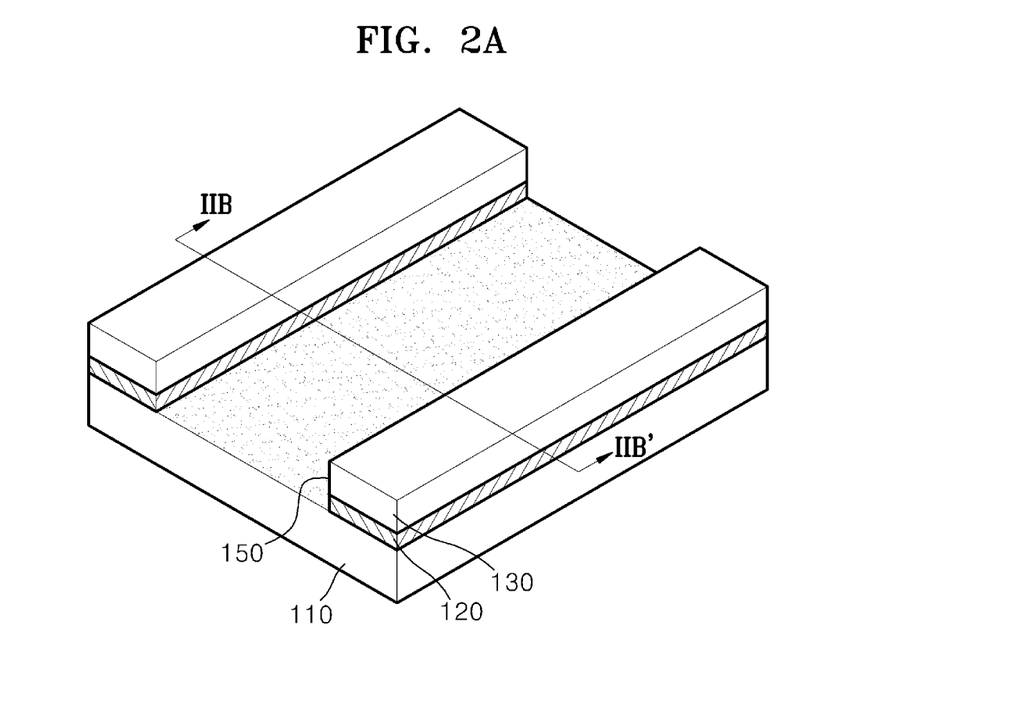
Figure 2B:
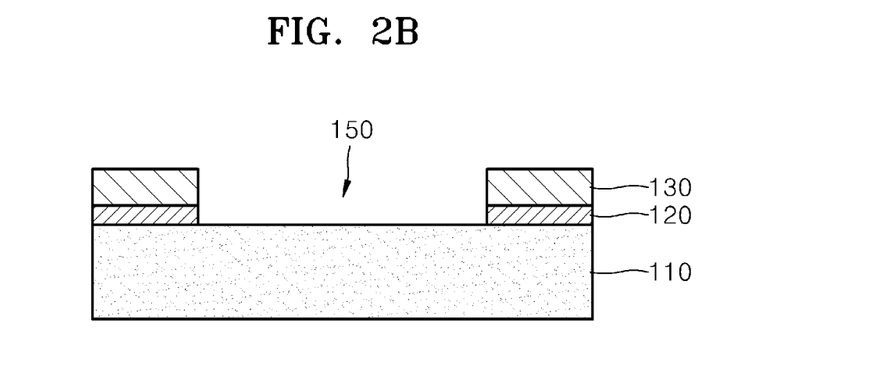

FIG. 2A is a perspective view showing that a groove 150 is formed in the protective layer 130 and the growth layer 120. FIG. 2B is a cross-sectional view cut along a line IB-IIB' of FIG. 2A.

Referring to FIGS. 2A and 2B, the groove 150 is formed in a predetermined shape by sequentially etching the protective layer 130 and the growth layer 120. The groove 150 exposes side surfaces of the protective layer 130 and the growth layer 120 and an upper surface of the substrate 110. The groove 150 may be formed by etching the protective layer 130 and the growth layer 120 by using an etching mask (not shown) until the upper surface of the substrate 110 is exposed. By "side," as that term is used herein (e.g., in the term "side surface"), it is meant a surface that is not in a parallel plane with the surface with which it is being compared. In embodiments discussed herein, for example, "side surface" may mean a surface that is not in a parallel plane with the substrate. While not required, some side surfaces may be perpendicular or generally perpendicular to the substrate.

Figure 3A:
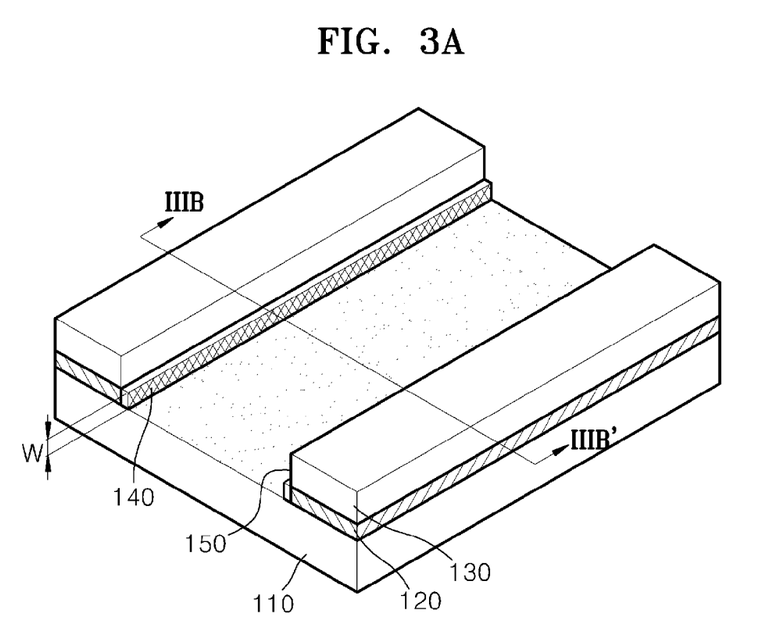
Figure 3B:
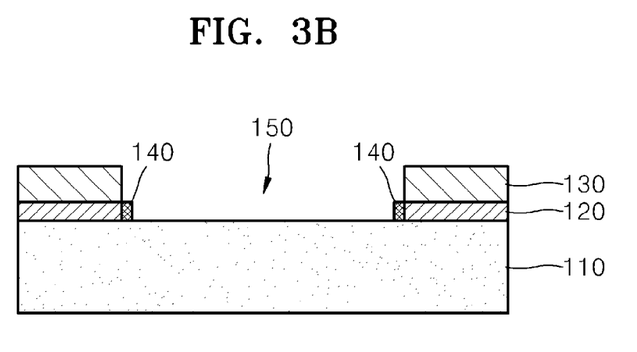
Figure 3C:
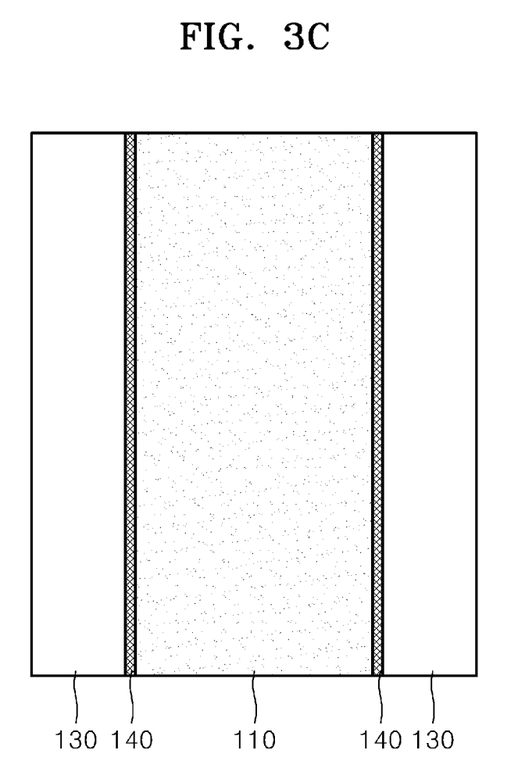

FIG. 3A is a perspective view showing that the graphene layer 140 is grown from the side surfaces of the growth layer 120. FIG. 3B is a cross-sectional view cut along a line IB-IIB' of FIG. 3A. FIG. 3C is a plan view of FIG. 3A.

Referring to FIGS. 3A through 3C, the graphene layer 140 is grown from the exposed side surfaces of the growth layer 120. That is, since the side surfaces of the growth layer 120 are exposed by the groove 150, the graphene layer 140 is grown from only the exposed side surfaces of the growth layer 120. The graphene layer 140 may be grown by using, for example, a chemical vapor deposition (CVD) method. Since the graphene layer 140 is grown from the side surfaces of the growth layer 120, the width W of the graphene layer 140 is the same as the thickness of the growth layer 120. As such, the graphene layer 140 may have a width of, for example, about several nanometers. If the thickness of the growth layer 120 is adjusted, the graphene layer 140 having a desired width may be obtained.

As described above, if the side surfaces of the growth layer 120 are exposed by the groove 150, and the graphene layer 140 is grown from the exposed side surfaces of the growth layer 120, the graphene layer 140 having a very small width may be formed on a large area. Although two side surfaces of the growth layer 120 are exposed and the graphene layer 140 is grown from the two exposed side surfaces in the above descriptions, the current embodiment is not limited thereto and one side surface or three or more side surfaces of the growth layer 120 may be exposed by changing the shape of the groove 150.

A graphene device may be manufactured by bonding electrodes (not shown) to the graphene structure illustrated in FIGS. 3A through 3C. Alternatively, a graphene device may be manufactured by bonding electrodes to only the graphene layer 140 separated from the graphene structure illustrated in FIGS. 3A through 3C.

Figure 4:
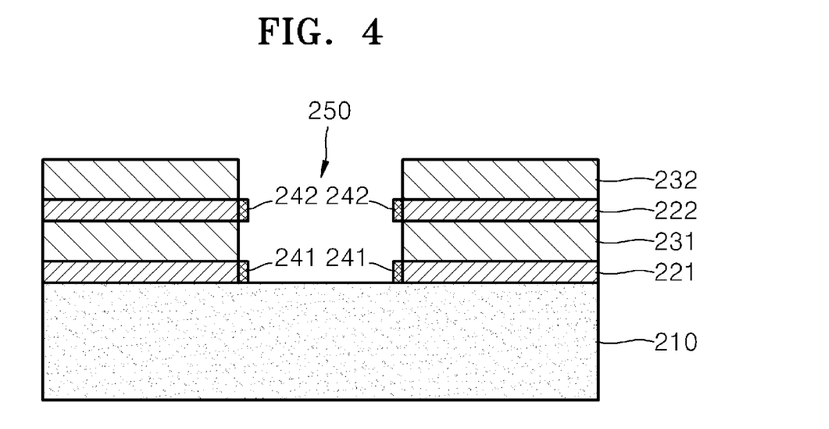
FIG. 4 is a cross-sectional view of a graphene structure according to another embodiment.

FIG. 4 is a cross-sectional view of a graphene structure according to another embodiment.

Referring to FIG. 4, a first growth layer 221, a first protective layer 231, a second growth layer 222, and a second protective layer 232 are sequentially formed on a substrate 210. A groove 250 is formed in the first growth layer 221, the first protective layer 231, the second growth layer 222, and the second protective layer 232 to expose an upper surface of the substrate 210. As such, side surfaces of the first growth layer 221, the first protective layer 231, the second growth layer 222, and the second protective layer 232 are also exposed by the groove 250. First and second graphene layers 241 and 242 are respectively formed from the exposed side surfaces of the first and second growth layers 221 and 222. Meanwhile, although the first and second graphene layers 241 and 242 and the first and second protective layers 231 and 232 are alternately stacked on the substrate 210 in FIG. 4 as an example, the current embodiment is not limited thereto and three or more growth layers and three or more protective layers may be alternately stacked on the substrate 210.

A method of manufacturing the graphene structure illustrated in FIG. 4 is the same as the method of manufacturing the graphene structure illustrated in FIGS. 1, 2A and 2B, and 3A through 3C except that the first and second graphene layers 241 and 242 and the first and second protective layers 231 and 232 are alternately stacked on the substrate 210, and thus a detailed description thereof will not be provided here. As described above, in the current embodiment, the first and second graphene layers 241 and 242 having a very small width may be aligned in a vertical direction as well as a horizontal direction. Also, a graphene device may be manufactured by bonding electrodes (not shown) to the graphene structure having the three-dimensionally aligned first and second graphene layers 241 and 242.

According to the above embodiments, graphene having a very small width may be easily formed, and may be used in various devices such as electronic devices, optical devices, sensors, capacitors, and energy devices.

FIGS. 5, 6A through 6D, and 7A through 7D are diagrams for describing a method of manufacturing a graphene device according to an embodiment.

Figure 5:
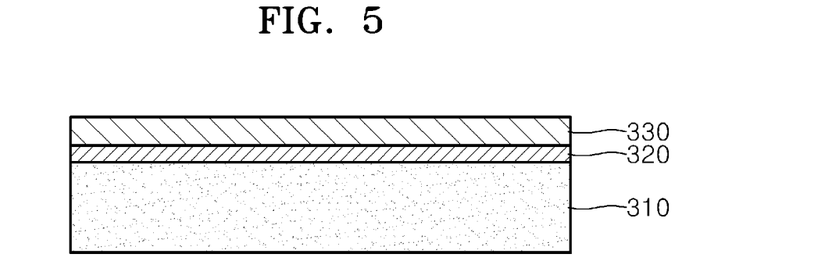
FIGS. 5, 6A through 6D, and 7A through 7D are diagrams for describing a method of manufacturing a graphene device according to an embodiment.

FIG. 5 is a cross-sectional view showing that a growth layer 320 and a protective layer 330 are sequentially formed on a substrate 310. Referring to FIG. 5, initially, the growth layer 320 is formed on the substrate 310. The substrate 310 may be, for example, a silicon substrate, but is not limited thereto. The growth layer 320 may be formed by depositing, for example, metal or Ge in the form of a thin film on the substrate 310. Here, the metal may include, but is not limited to, transition metals such as Ni, Pt, Ru, Co, Ir, and Cu. If the growth layer 320 is formed of Ge, graphene may be grown in an uncontaminated state with a uniform thickness. The growth layer 320 may have a thickness of, for example, about several nanometers. As will be described later, the thickness of the growth layer 320 determines a width of channels 343 (see FIGS. 7A and 7B) formed of a first graphene layer. Then, the protective layer 330 is formed on an upper surface of the growth layer 320. The protective layer 330 may be formed by depositing, for example, silicon oxide on the upper surface of the growth layer 320.

Figure 6A:
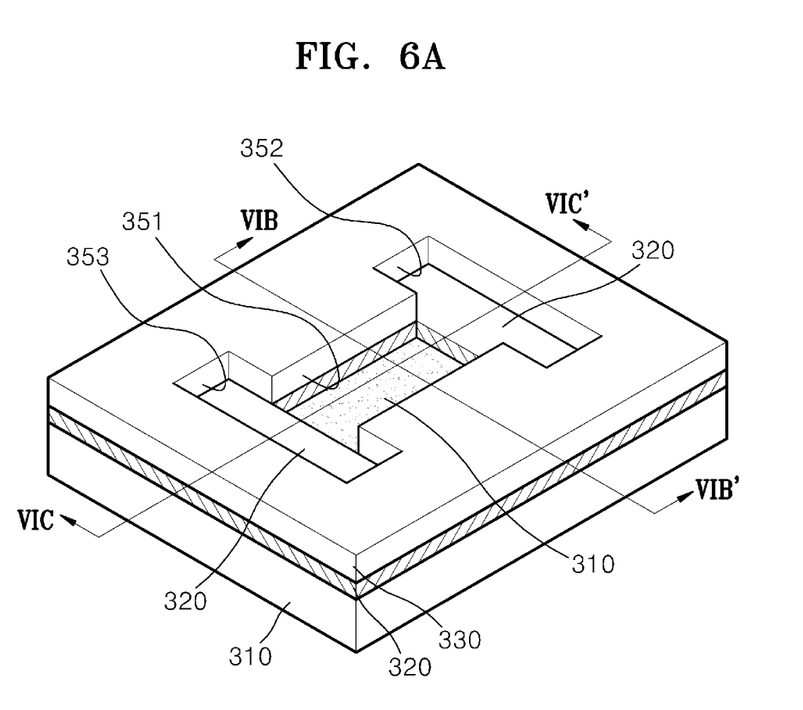
Figure 6B:
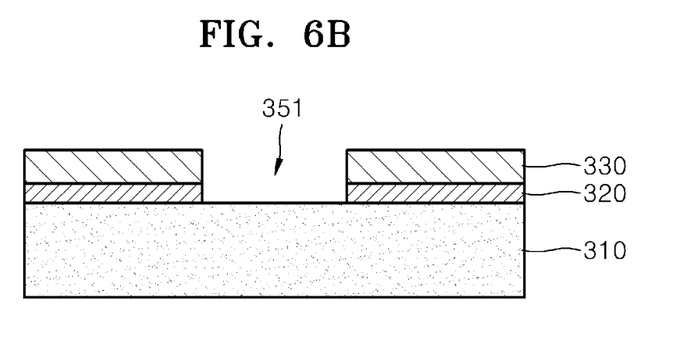
Figure 6C:
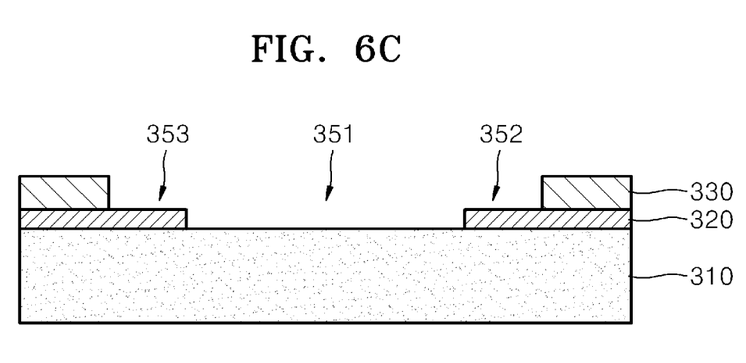
Figure 6D:
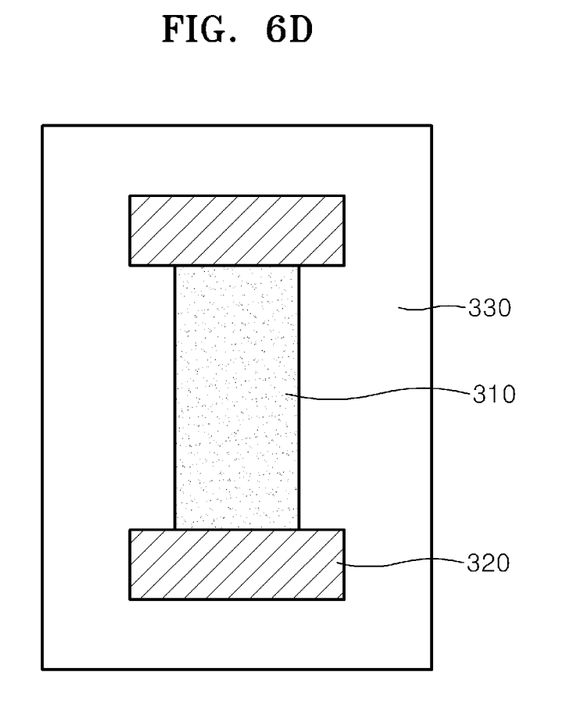

FIG. 6A is a perspective view showing that first, second, and third grooves 351, 352, and 353 are formed. FIG. 6B is a cross-sectional view cut along a line VIB-VIB' of FIG. 6A. FIG. 6C is a cross-sectional view cut along a line VIC-VIC' of FIG. 6A. FIG. 6D is a plan view of FIG. 6A.

Referring to FIGS. 6A through 6D, the first groove 351 is formed in the protective layer 330 and the growth layer 320 to expose an upper surface of the substrate 310, and the second and third grooves 352 and 353 are formed in the protective layer 330 to expose an upper surface of the growth layer 320. Here, the second and third grooves 352 and 353 are connected to two ends of the first groove 351. Side surfaces of the protective layer 330 and the growth layer 320 are also exposed by the first groove 351, and other side surfaces of the protective layer 330 are also exposed by the second and third grooves 352 and 353. The first, second, and third grooves 351, 352, and 353 may be formed by etching the protective layer 330 to expose the upper surface of the growth layer 320, and partially etching the exposed upper surface of the growth layer 320 to expose the upper surface of the substrate 310. However, the first, second, and third grooves 351, 352, and 353 are not limited thereto and may be formed based on various etching orders.

Figure 7A:
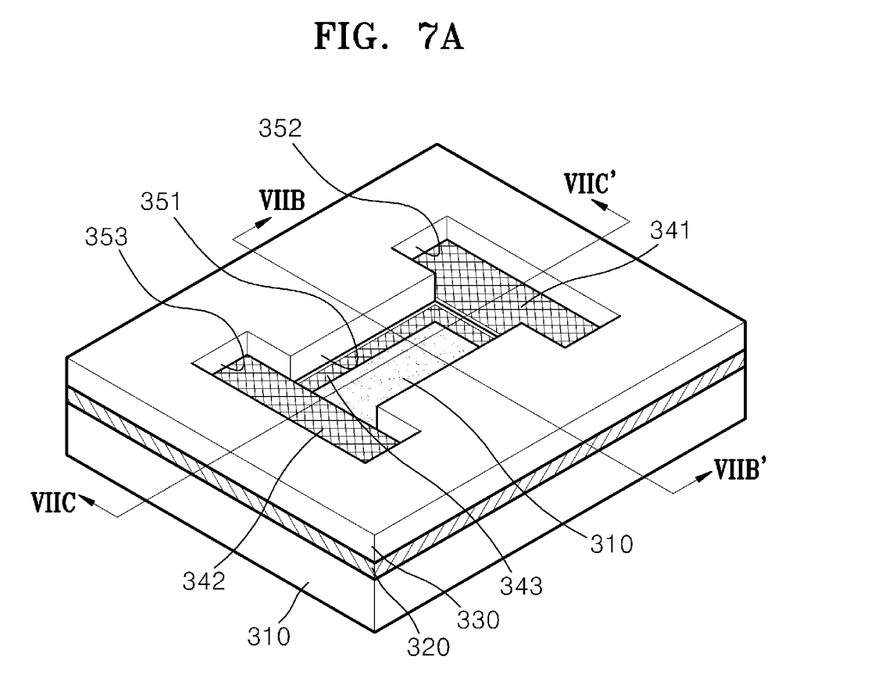
Figure 7B:
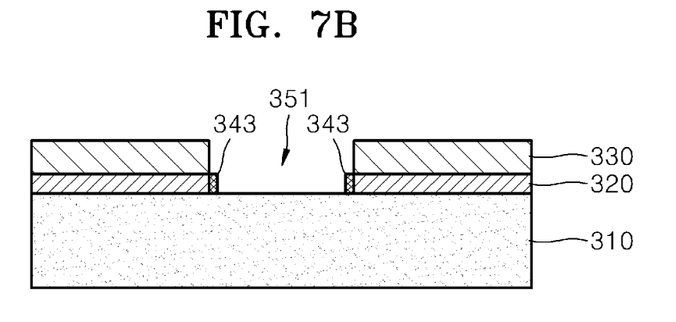
Figure 7C:
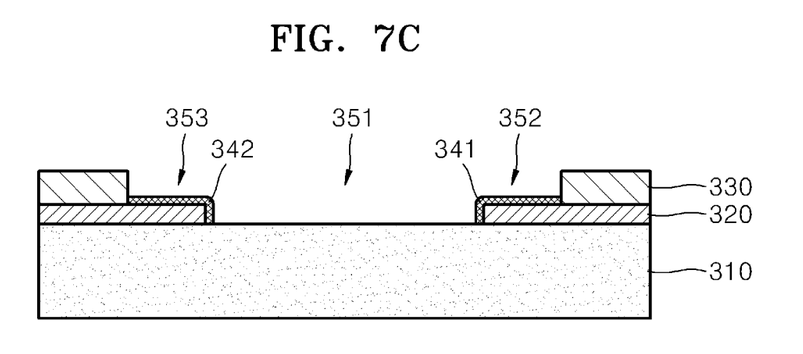
Figure 7D:
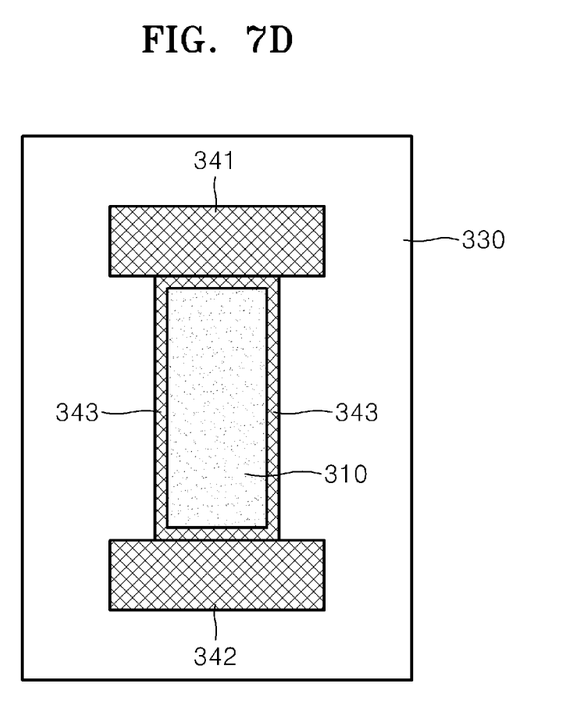

FIG. 7A is a perspective view showing that the channels 343 and first and second electrodes 341 and 342 are formed. FIG. 7B is a cross-sectional view cut along a line VIIB-VIIB' of FIG. 7A. FIG. 7C is a cross-sectional view cut along a line VIIC-VIIC' of FIG. 7A. FIG. 7D is a plan view of FIG. 7A.

Referring to FIGS. 7A through 7D, graphene is grown from the side surfaces and the upper surface of the growth layer 320 exposed by the first, second, and third grooves 351, 352, and 353. In more detail, the side surfaces of the growth layer 320 are exposed by the first groove 351, and a first graphene layer is grown from the exposed side surfaces of the growth layer 320. As such, the channels 343 formed of the first graphene layer are obtained. The channels 343 may have a width of about several nanometers in correspondence with a thickness of the growth layer 320. If the thickness of the growth layer 320 is adjusted, the channels 343 having a desired width may be formed.

A second graphene layer is grown from the upper surface of the growth layer 320 exposed by the second and third grooves 352 and 353. As such, the first and second electrodes 341 and 342 formed of the second graphene layer are obtained. Since the first and second graphene layers are respectively grown from the side surfaces and the upper surface of the growth layer 320, the first graphene layer is formed perpendicularly to the second graphene layer, i.e., the first graphene layer is formed in a plane perpendicular to the plane in which the second graphene layer is formed. In alternative embodiments, the planes in which the first and second graphene layers are formed are not parallel, but are not necessarily perpendicular. In the embodiment discussed herein, the first and second graphene layers are grown to be electrically connected to each other, although it is not required that the first and second graphene layers are electrically connected, and in alternative embodiments, they may not be electrically connected. As such, the first and second electrodes 341 and 342 may be integrally formed with the channels 343. The first and second graphene layers may be grown by using, for example, a CVD method.

As described above, if the first and second graphene layers are grown from the side surfaces and the upper surface of the growth layer 320 exposed by the first, second, and third grooves 351, 352, and 353, the channels 343 and the first and second electrodes 341 and 342 formed of graphene may be obtained. As such, a graphene device in which the first and second electrodes 341 and 342 are integrally formed with the channels 343 may be manufactured. Accordingly, a bonding error that can be caused when electrodes formed of metal are bonded to a channel formed of graphene may be solved. The graphene device may be used as, for example, a transistor.

If the substrate 310, the growth layer 320, and the protective layer 330 are removed from the graphene device illustrated in FIGS. 7A through 7D, an electrode-integrated graphene device including only the channels 343 formed of the first graphene layer and the first and second electrodes 341 and 342 formed of the second graphene layer may be manufactured. However, according to a purpose, the graphene device illustrated in FIGS. 7A through 7D may be used as it is.

Although two channels 343 are formed between the first and second electrodes 341 and 342 in the above descriptions as an example, if the shape of the first groove 351 is changed, one or three or more channels may be formed between the first and second electrodes 341 and 342.

Figure 8:
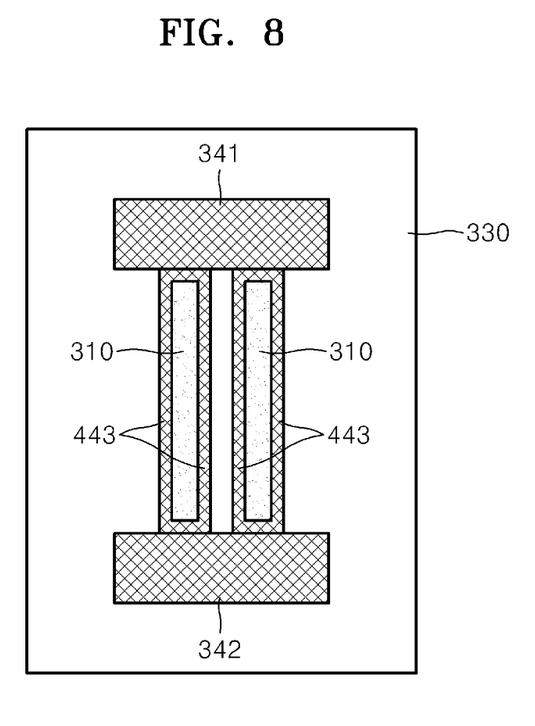
FIG. 8 is a plan view of a graphene device according to another embodiment.

FIG. 8 shows a graphene device having four channels 443.

Referring to FIG. 8, the four channels 443 are formed in parallel between the first and second electrodes 341 and 342. A method of manufacturing the graphene device illustrated in FIG. 8 is similar to the method of manufacturing the graphene device illustrated in FIGS. 5, 6A through 6D, and 7A through 7D.

In more detail, the growth layer 320 and the protective layer 330 are sequentially formed on the substrate 310, and then two first grooves (not shown) for exposing the substrate 310, and second and third grooves (not shown) for exposing the growth layer 320 are formed. Then, the four channels 443 are formed by growing the first graphene layer from side surfaces of the growth layer 320 exposed by the two first grooves. The first and second electrodes 341 and 342 are formed by growing the second graphene layer from an upper surface of the growth layer 320 exposed by the second and third grooves. Here, the first and second electrodes 341 and 342 may be integrally formed with the four channels 443. As described above, if the shape or number of the first grooves 351 is adjusted, a desired number of the channels 443 may be formed between the first and second electrodes 341 and 342.

As described above, a graphene device in which various numbers of the channels 443 are formed between and integrally with the first and second electrodes 341 and 342 may be manufactured. As such, the amount of current that flows through the channels 443 may be increased. Also, since all channels 443 are integrally formed with the first and second electrodes 341 and 342, a graphene device having a very stable structure may be achieved.

As described above, according to one or more of the above embodiments, since graphene grows from exposed side surfaces of a growth layer, the graphene having a very small width may be easily formed on a large area. Also, since a channel and electrodes are formed by using only graphene, the electrodes may be integrally formed with the channel. As such, a bonding error between the electrodes and the channel may be prevented.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing a graphene device, the method comprising:
    sequentially forming a growth layer and a protective layer on a substrate;
    forming at least one first groove penetrating the protective layer and the growth layer to expose side surfaces of the growth layer and the protective layer and an upper surface of the substrate, and second and third grooves penetrating the protective layer to expose side surfaces of the protective layer and an upper surface of the growth layer;
    forming at least one channel by growing at least one first graphene layer on the side surfaces of the growth layer exposed by the at least one first groove; and
    forming first and second electrodes by growing a second graphene layer on the upper surface of the growth layer exposed by the second and third grooves.

2. The method of claim 1, wherein the growth layer is formed by depositing metal or germanium (Ge) on the substrate.

3. The method of claim 1, wherein the growth layer has a thickness of several nanometers.

4. The method of claim 1, wherein the protective layer is formed by depositing silicon oxide on the growth layer.

5. The method of claim 1, wherein the first and second graphene layers are grown from the exposed side surfaces and the upper surface of the growth layer by using a chemical vapor deposition method.

6. The method of claim 1, wherein the second and third grooves are connected to two ends of the at least one first groove.

7. The method of claim 2, wherein the first and second electrodes are integrally formed with the at least one channel.

8. The method of claim 7, wherein the at least one first graphene layer is formed perpendicularly to and is electrically connected to the second graphene layer.

9. A graphene device comprising:
    at least one channel comprising a first graphene layer; and
    first and second electrodes connected to two ends of the at least one channel and comprising a second graphene layer,
    wherein the first graphene layer is disposed only in a plane not parallel to the second graphene layer, and the only graphene layer to which the first graphene layer is electrically connected is the second graphene layer in the first and second electrodes.

10. The graphene device of claim 9, wherein the first and second electrodes are integrally formed with the at least one channel.

11. The graphene device of claim 9, wherein the first graphene layer is formed perpendicularly to the second graphene layer.

12. The graphene device of claim 9, wherein a plurality of channels are formed between the first and second electrodes, and are aligned in at least one of a horizontal direction and a vertical direction.

13. The graphene device of claim 9, wherein each of the at least one channel has a width of several nanometers.

* * * * *